United States Patent [19]

Lee

[11] Patent Number: 5,508,762
[45] Date of Patent: Apr. 16, 1996

[54] CONTROLLING METHOD FOR A MULTISYSTEM BY A MODE-CONVERSION KEY

[75] Inventor: Sang Su Lee, Suweon, Rep. of Korea

[73] Assignee: SamSung Electronics Co., Ltd., Suwon, Rep. of Korea

[21] Appl. No.: 701,824

[22] Filed: May 17, 1991

[30] Foreign Application Priority Data

May 23, 1990 [KR]   Rep. of Korea ............... 7569/1990

[51] Int. Cl.⁶ .................................................. H04N 1/44
[52] U.S. Cl. ........................ 348/734; 348/732; 348/731; 348/570
[58] Field of Search ........................ 358/194.1, 193.1, 358/192.1, 188, 181, 191.1; H04N 5/44

[56] References Cited

U.S. PATENT DOCUMENTS

| | | | |
|---|---|---|---|
| 4,214,274 | 7/1980 | Rzeszewski | 358/193.1 |
| 4,279,035 | 7/1981 | Skerlos | 358/192.1 |
| 4,358,791 | 11/1982 | French | 358/193.1 |
| 4,525,740 | 6/1985 | Borg | 358/192.1 |
| 4,527,194 | 7/1985 | Sirazi | 358/192.1 |
| 4,776,038 | 10/1988 | Testin | 358/193.1 |
| 4,821,122 | 4/1989 | Teskey | 358/193.1 |
| 4,823,387 | 4/1989 | Tults | 358/193.1 |
| 4,918,531 | 4/1990 | Johnson | 358/193.1 |
| 4,996,597 | 2/1991 | Duffield | 358/181 |
| 5,087,977 | 2/1992 | Suizu | 358/193.1 |
| 5,103,314 | 4/1992 | Keenan | 358/194.1 |

*Primary Examiner*—James J. Groody
*Assistant Examiner*—Sherrie Hsia
*Attorney, Agent, or Firm*—Robert E. Bushnell

[57] ABSTRACT

Televisions (TV) and video tape recorders (VTR) carry out the tuning operation by using a microcomputer. The microcomputer converts the modes in sequence of conventional air mode, cable TV Standard mode, cable TV Harmonic Relate Carrier mode, and multibroadcasting mode according to the inputted signal from a key matrix to control both the conventional and multibroadcasting modes which have the different channel frequencies from each other. Thus, independent systems or additional programs for multimode systems are not necessary.

6 Claims, 3 Drawing Sheets

CONTROLLING METHOD FOR A MULTISYSTEM BY A MODE-CONVERSION KEY

BACKGROUND OF THE INVENTION

The present invention relates to televisions (TV's) and video tape recorders (VTR's) and more particularly to a controlling method for a multisystem that controls two broadcasting ways modes by manipulation of a mode-conversion key in a broadcasting system such as NTSC or PAL which is tuned by a microcomputer (MICOM).

Generally, in the systems which are tuned by MICOM, if the broadcasting ways or the frequencies used are different from each other, it is impossible to control several broadcasting ways by one controlling system.

Therefore, independent system must be set up, or a program of MICOM should be newly designed for the realization of the multisystem.

SUMMARY OF THE INVENTION

The present invention solves above-identified problem by providing a controlling method for a multisystem by a mode-conversion key that controls two broadcasting ways in a system having different channel frequencies.

The present invention, is a controlling method for a multisystem which carries out the tuning operation by recognizing the signals inputted from a key matrix, comprising:

a first routine for selecting the corresponding broadcasting way, displaying and tuning the selected broadcasting way mode if an inputted key signal indicates mode-conversion, and a second routine for carrying out the tuning of a corresponding channel in the sequential channel selection if the inputted key signal is not for the mode-conversion.

BRIEF DESCRIPTION OF THE DRAWINGS

These and other objects, features, and advantages of the present invention will become more apparent from the following description for the preferred embodiments taken in conjunction with the accompanying drawings, in which.

DETAILED DESCRIPTION OF THE INVENTION

The present invention will now be described in more detail with reference to the accompanying drawings.

Figure 1:
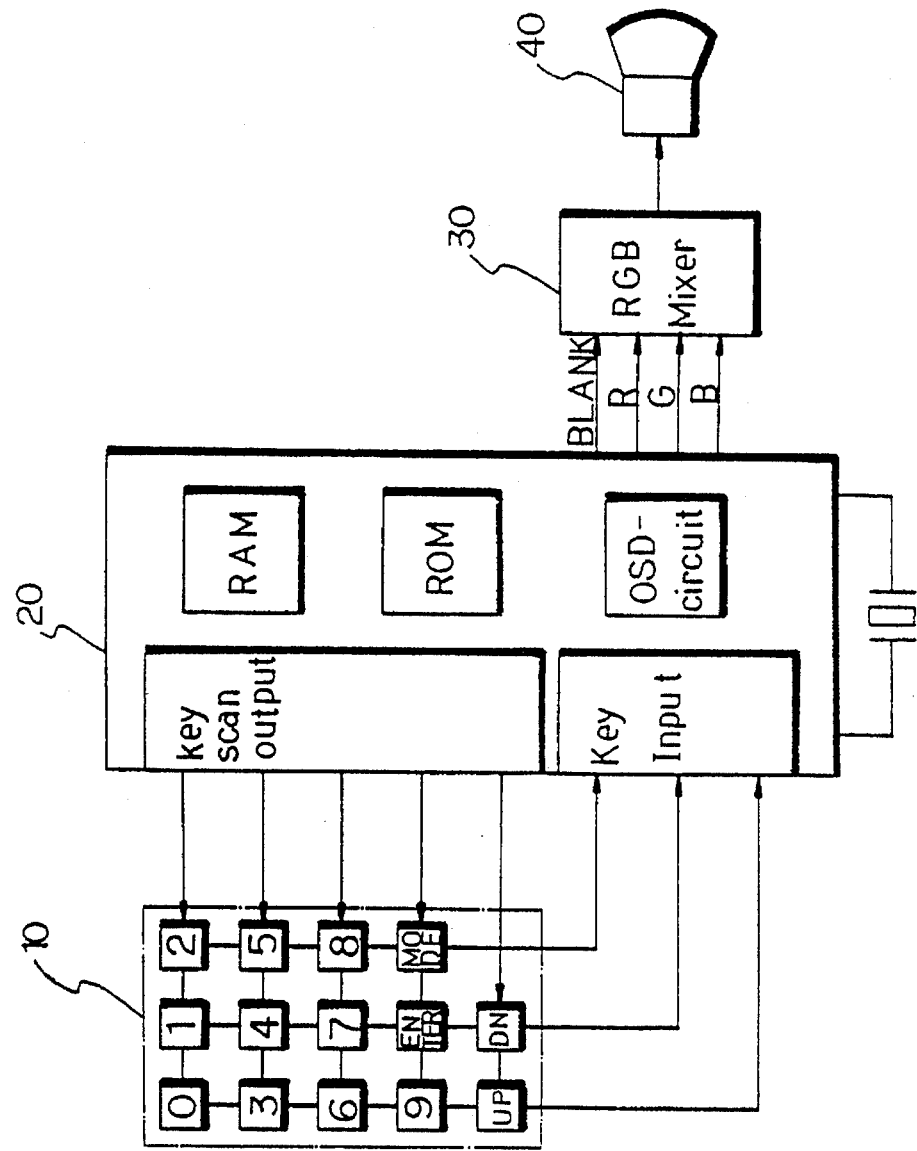
FIG. 1 shows a block diagram of the system for performing a control method by using a mode-conversion key according to the present invention.

FIG. 1 shows a block diagrams of the system for carrying out a control method by using a mode-conversion key according to the present invention.

A key matrix 10 is connected to a MICOM 20 and thus the key input signal is transferred to the MICOM 20. A 8-bit or 4-bit counter is provided in the MICOM 20. Also, a RUB mixer 30 is connected to the MICOM 20 in order to display the broadcasting signal corresponding to the selected broadcasting way on the cathode ray tube (CRT) 40.

Figure 2A:
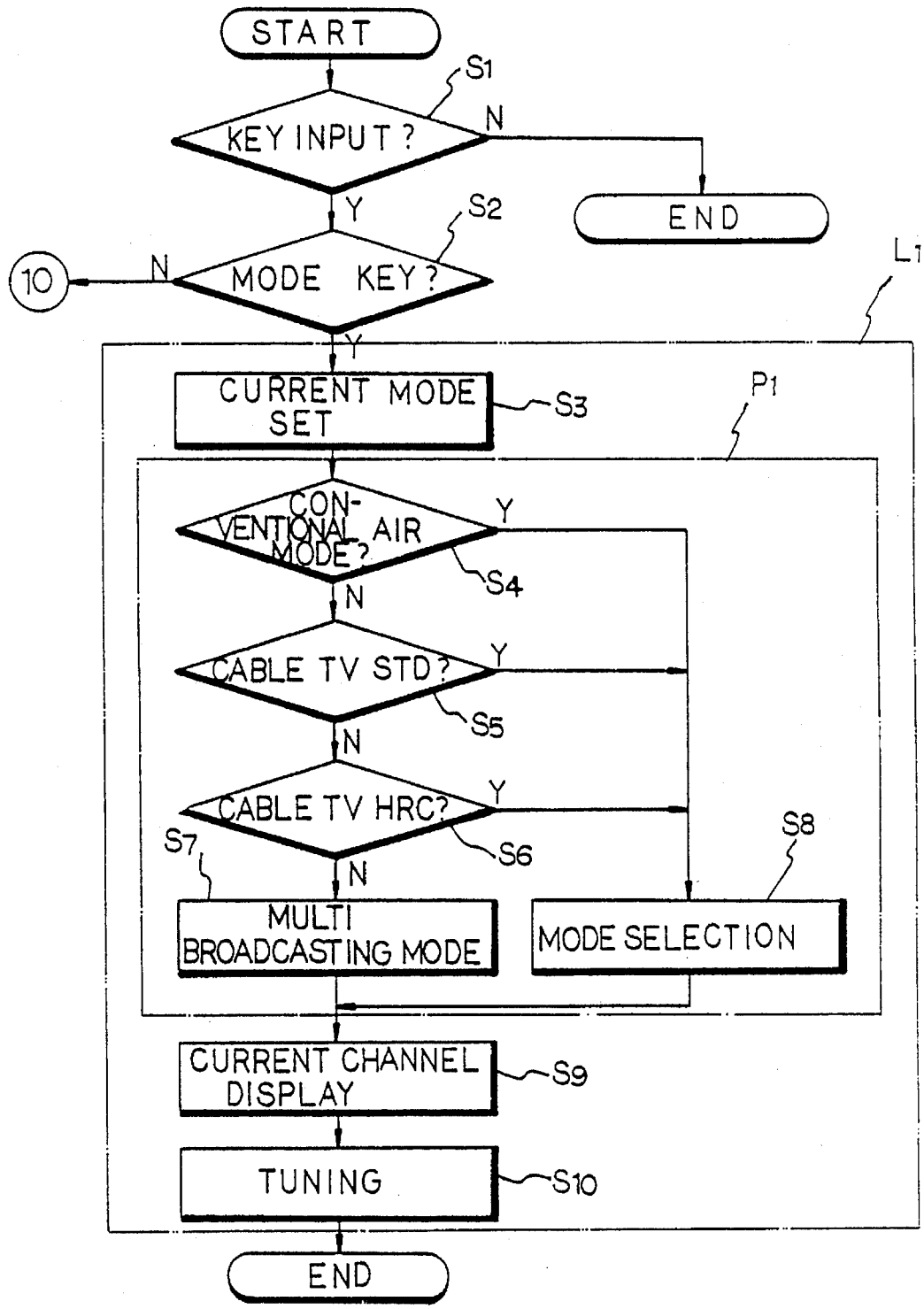
FIGS. 2(A) and 2(B) show a flowchart of a control method by using a mode-conversion key according to the present invention.
Figure 2B:
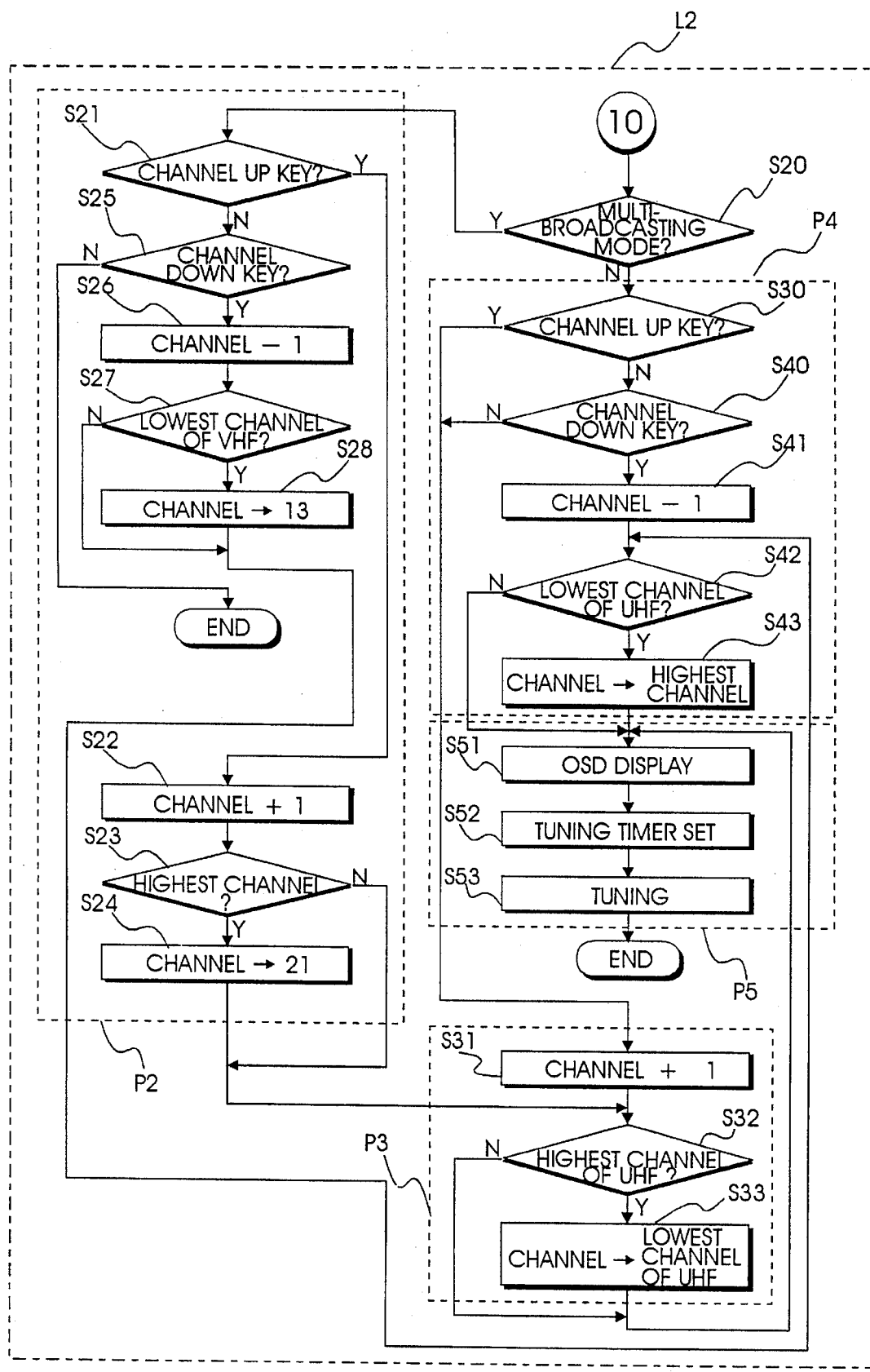

FIGS. 2(A) and 2(B) show a flowchart of a method for controlling the multisystem by using a mode-conversion key.

The flowchart is composed of a first routine L1 for selecting the corresponding broadcasting way if the input key is a mode-conversion one, displaying and tuning the selected broadcasting way and a second routine L2 for tuning a corresponding channel if the input key is proven not to be a mode-conversion key.

In the first routine L1, a first process P1 converts sequentially the broadcasting modes in response to a last selected mode in a step S3 i.e. the mode when the power was last turned off, by selection of the mode-conversion key. After the first process P1, a step S9 for displaying the selected broadcasting mode and a step S10 for tuning the selected mode is subsequently carried out.

In the second routine L2, on the other hand, a second process P2 that selects a next channel, distinguishing the lowest or highest channel from each other, corresponding to the selected broadcasting mode when a channel-up or down key signal is entered in the case of a multibroadcasting mode and a third process P3 that increases the channel and selects the lowest channel if the increased channel is the highest channel when the channel-up key signal is entered in the case of not multi-broadcasting mode or not mode-conversion, are carried out. Similarly, if the input key is the channel-down signal, a fourth process P4 that decreases the channel and selects the highest channel if the decreased channel is the lowest channel is carried out. After the third and fourth processes P3 and P4, the fifth process P5 that tunes the corresponding channel is carried out.

Now the effect of the present invention is described.

First, the MICOM 20 checks the input signal from the key matrix 10 in a step 31 and checks whether the input signal is the mode-conversion key signal in a step 62. In case of the mode-conversion, the mode is converted after the current mode is set in a step 33. The current mode corresponds to a current mode at the time when the power was last turned off.

Thus if the current mode is either conventional air mode or cable TV mode, the mode is converted, while if the current mode is neither the air mode nor the cable TV mode, the multibroadcasting mode is set in steps S4~S8.

The sequence of mode conversion is as follows: the conventional air mode→the cable TV STD(Standard) mode→the cable TV HRC(Harmonic Relate Carrier) mode→multibroadcasting mode. That is, if the mode-conversion signal is entered from the key matrix K, the mode is converted one by one after the current mode is set. In other words, the multibroadcasting mode is added instead of the conventional cable TV IRC(Incremental Relate Carrier) mode.

Then, after the mode is selected by the mode-conversion key input signal, the selected current channel is displayed and tuned to carry out the selected mode in steps S9 and S10, where as above, the display of the current channel does not mean the display on the screen but the internal recognition of the MICOM 20.

If another key signal, not the mode-conversion key signal, is entered the mode is checked to determine if it is the multibroadcasting mode or otherwise step S20, and then, in case of the multibroadcasting mode, the channels 14–20 must be skipped by the channel up/down keys. That is, the various broadcasting ways are allowable in the multibroadcasting mode, but, in the present invention, the German broadcasting way is taken as an example.

In the German broadcasting way, the channels 2~13 correspond to VHF channel mode and the channels 21~69 correspond to UHF channel mode, and thus, the channels 14~20 are skipped. Thus, if the channel-up key signal enters in the multibroadcasting mode, the one-increased channel is checked for whether it is the highest channel 13 of the German VHF broadcasting way or not in steps S22 and S23.

Similarly, if the channel-down key signal enters, one-decreased channel is checked for whether it is the lowest channel 21 of the German UHF broadcasting way or not in steps S25 and S26. Then, if the one-increased channel is not the channel 13, the channel is again increased.

By repeating this, when the channel meets the channel 13, the current channel is converted to the channel 21 which is the lowest channel for the UHF broadcasting way, in a step 24 and again, the channel is checked to be the highest channel in a step S32. On the other hand, if the one-decreased channel is not the channel 21, the channel is again decreased.

By repeating this, if the channel meets the channel 21, the current channel is converted to the channel 13 which is the highest channel for the VHF broadcasting way in a step S28 and the channel is checked again for whether it is the lowest channel or not, in a step S42.

Thus, if the increased or decreased channel is not the channel 69 or 2, respectively, the increased or decreased channel is displayed in a step S51 and the tuning time is set to the 8-bit or 4-bit counter in the MICOM 20, displaying the time on screen, and tuning the channel is carried out in steps S52 and S53. In korean case, the tuning time is 3 seconds.

To the contrary, if the increased channel is the highest channel 69, the channel is converted to the lowest channel 2 in a step S33 and the tuning process is repeated in steps S51~S53, while if the decreased channel is the lowest channel 2, the channel 2 is converted to the highest channel 69 in a step S43 and the tuning process is carried out in the steps S51~S53. Thus, in the multibroadcasting mode, the channels 2~13 and 21~69 are sequentially selected while skipping the unavailable channels 14~20.

On the other hand, if the inputted key signal is not one of the mode conversion key signal and the multibroadcasting mode key signal, but the channel-down key signal, the channel is one-decreased and is checked for whether it is the lowest channel or not, in a step S42. In korean case, the lowest channel is the channel 2 for the air mode, and the channel 1 for the cable TV STD mode, while in U.S.A. the lowest channel for the air mode is the channel 3. After the step S42, if the decreased channel is not the lowest channel, the channel is displayed on screen in a step S51 and the tuning of the channel is carried out by setting the 3-second timer in steps S52 and S53.

On the other hand, if the decreased channel is the lowest channel, the channel is converted to the highest channel and subsequently the tuning of the channel is carried out in steps S51~S53. The highest channel for the conventional air mode is the channel 83 in korea and the channel 69 in U.S.A.

Similarly, if the inputted key signal is the channel-up key signal, the channel is one-increased in a step S30 and subsequently is compared with the highest channel in steps S31 and S32. So, if the increased channel is not the highest channel, the tuning steps S51~S53 are carried out, while if the increased channel is the highest one, the channel is converted to the lowest one in a step S33 and subsequently the same tuning steps S51~S53 are carried out.

As described up to now, the present invention can control the mode in a sequence of air mode, cable TV STD mode, cable TV HRC mode and multibroadcasting mode by the mode-conversion key. The newly added multibroadcasting mode has a different channel frequency and thus its broadcasting way is different from the conventional one. But, all the modes can be controlled by the mode-conversion key in a single broadcasting system. Thus, independent systems for multibroadcasting way are not required and an additional program is not necessary since the present invention controls two broadcasting ways by a single mode-conversion key.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall with in the true scope of the invention.

What is claimed is:

1. A method for controlling a television signal tuner, said method comprising:

a first routine for selecting between a plurality of broadcasting modes in response to a mode-conversion signal, said plurality of broadcasting modes comprising a multibroadcasting mode, and a second routine for tuning a current channel in response to channel selection.

2. The method according to claim 1, wherein said first routine comprises setting a current mode to a most recent mode, then successively converting the current mode to a different one of said plurality of broadcasting modes in response to a mode conversion signal, displaying the current mode, and tuning in response to the current mode.

3. The method according to claim 1, wherein said second routine comprises:

in response to a channel-up key, incrementing the current channel unless the current channel is the highest channel, if the current channel is the highest channel selecting the lowest channel as the current channel, in response to a channel-down key, decrementing the current channel unless the current channel is the lowest channel, if the current channel is the lowest channel selecting the highest channel as the current channel, and after decrementing or incrementing, tuning in response to the current channel.

4. The method according to claim 3, wherein said second routine further comprises the following steps if the selected broadcasting mode is said multibroadcasting mode:

if the current channel is a lowest channel of a higher-range of channels, selecting a highest channel of a lower-range of channels as the current channel in response to said channel-down key signal, and if the current channel is a highest channel in the lower-range, selecting a lowest channel in the higher-range as the current channel in response to said channel-up key signal.

5. The method according to claim 3, wherein said tuning comprises:

displaying the current channel on screen, tuning the current channel by setting a tuning time for a counter in a microcomputer and displaying the tuning time, and converting to the current channel.

6. The method according to claim 1, wherein said plurality of broadcasting modes further comprises at least one of a conventional air mode, a cable television standard mode, and a cable television harmonic relate carrier mode.

* * * * *